June 20, 1967 E. E. BOYLE 3,327,258

SATURABLE INDUCTOR RADIO FREQUENCY TUNING DEVICE

Filed March 23, 1965 2 Sheets-Sheet 1

INVENTOR
EUGENE E. BOYLE
BY Edward A. Sokolski
ATTORNEY

June 20, 1967 E. E. BOYLE 3,327,258

SATURABLE INDUCTOR RADIO FREQUENCY TUNING DEVICE

Filed March 23, 1965 2 Sheets-Sheet 2

INVENTOR
EUGENE E. BOYLE
BY Edward A. Sokolski
ATTORNEY

United States Patent Office 3,327,258

Patented June 20, 1967

3,327,258
SATURABLE INDUCTOR RADIO FREQUENCY TUNING DEVICE

Eugene E. Boyle, 7466 W. 93rd Place, Los Angeles, Calif. 90045

Filed Mar. 23, 1965, Ser. No. 442,132
14 Claims. (Cl. 334—12)

Figure 1:
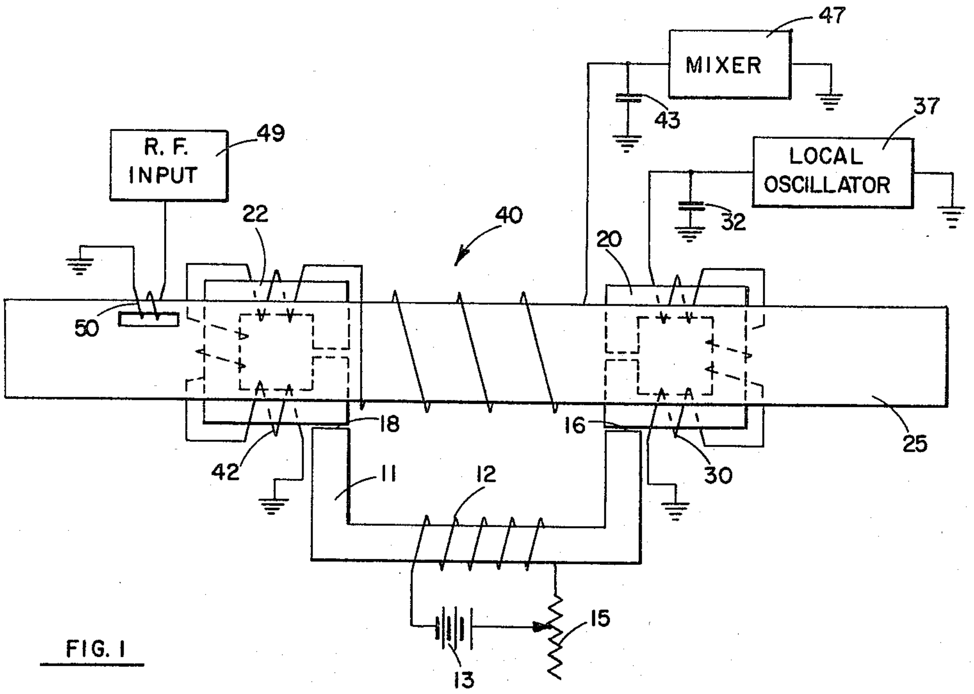

This invention relates to a radio frequency tuning device and more particularly to such device utilizing saturation tuning suitable for tuning radio frequency circuits from a remote location.

Saturation tuning devices have been developed for simultaneously tuning a plurality of radio frequency circuits from a remote location by varying the magnetic flux in an inductor core and thus changing the effective inductance of various windings associated therewith. Such devices of the prior art have several shortcomings. First, it is difficult to maintain proper tracking between the various tuned circuits over the tuning range. Improper tracking, for example, between the oscillator and mixer stages of a superheterodyne receiver results in lowered selectivity and sensitivity, thereby greatly impairing receiver performance. Further, with inductive tuning, it is difficult to maintain an optimum "*L/C*" ratio over an appreciable tuning range. This problem and the saturation characteristics of the magnetic core utilized often results in a lowered "Q," contributing further to lowered sensitivity and selectivity. These factors result in a sacrifice of receiver performance to achieve the advantageous features of saturation tuning. Such a sacrifice of performance is undesirable in any case, but is especially significant in situations where the receiver is to be utilized for communication purposes or for the particular broadcast listener where the highest possible selectivity and sensitivity is necessary.

The device of this invention provides remote control saturation tuning for a radio receiver in which not only is there no sacrifice in receiver performance, but which has improved sensitivity and selectivity characteristics as compared with conventional receivers. The device of this invention is capable of maintaining close tracking between the tuned circuits and provides high "Q" characteristics in such circuits.

The improvement is achieved in the device of the invention by utilizing an elongated magnetic core member for one of the tuned circuits and a substantially closed loop magnetic core for the other of such circuits. The elongated member which may be in the form of a linear magnetic bar fabricated of a material such as ferrite extends across the magnetic gap of an electromagnetic core the windings of which are excited with a control current. The substantially closed loop core which may be in the form of a toroid is placed between the bar and one of the pole pieces of the control electromagnet. Thus, a series electromagnetic circuit is formed between the electromagnet core, the linear core, and the substantially closed loop core. For improved tracking characteristics, a second substantially closed loop core member similar to the first may be added in the series magnetic circuit between the linear core member and the other electromagnet pole piece, a portion of the winding wound around the linear bar member being wound around the second core member. Still further sensitivity and improvement of performance are achieved by making the linear core extend beyond the ends of the two electromagnet pole pieces.

It is therefore an object of this invention to provide an improved remote tuning device for a radio frequency receiver.

It is still a further object of this invention to provide radio frequency tuning circuits having improved sensitivity and selectivity characteristics over similar prior art devices.

It is still a further object of this invention to provide improved tracking of radio frequency circuits tuned by saturation tuning techniques.

It is still a further object of this invention to provide an improved radio frequency tuning device of relatively economical construction.

Figure 2:
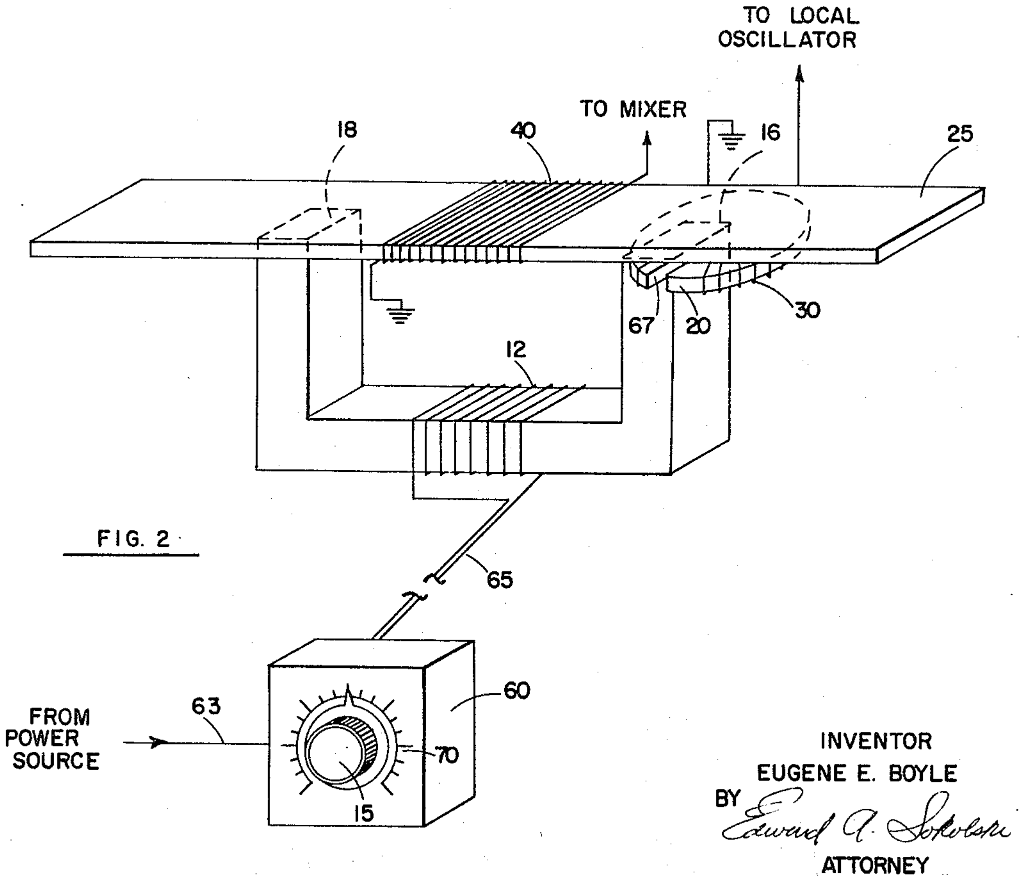
Figure 4:
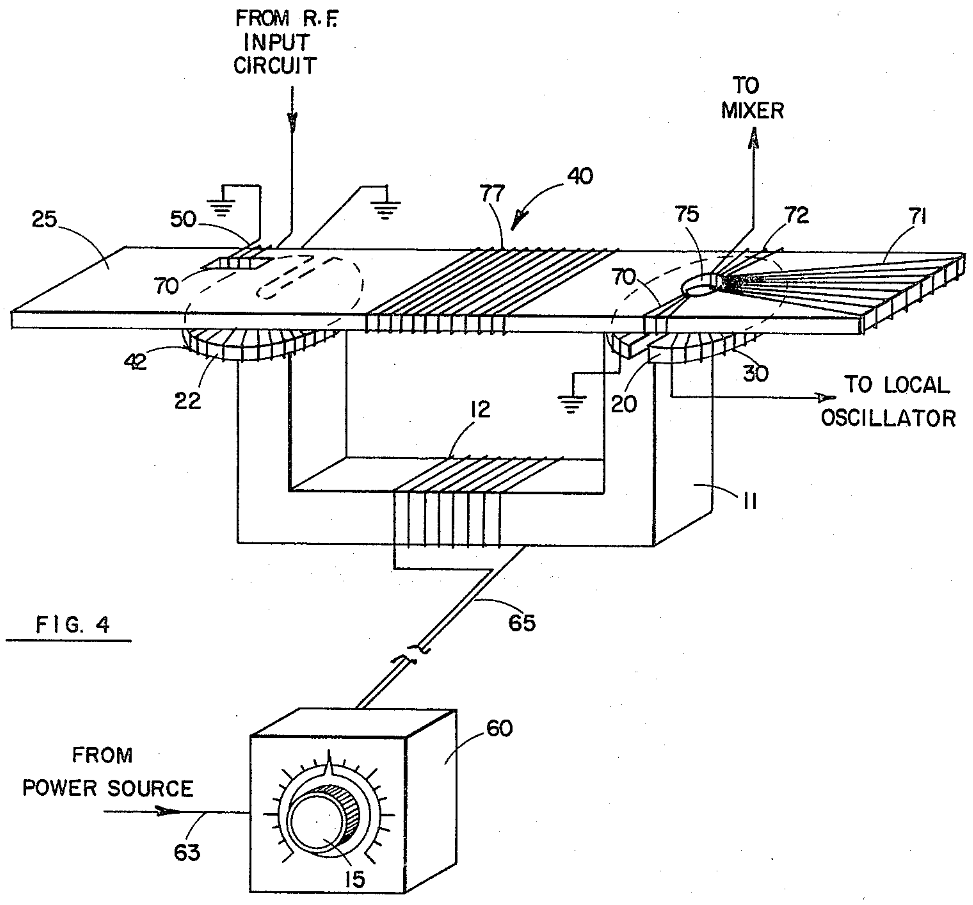
Figure 3:
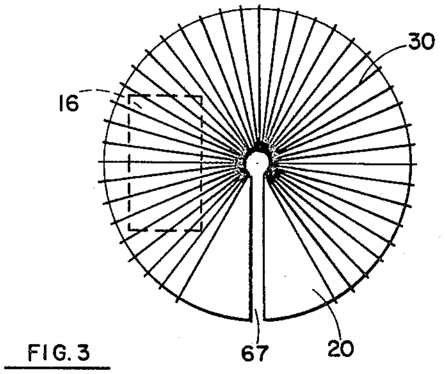

Other objects of this invention will become apparent from the following description taken in connection with the accompany drawings of which, FIG. 1 is a schematic drawing illustrating the operation of the device of the invention, FIG. 2 is a perspective view illustrating a first embodiment of the device of the invention, FIG. 3 is a plan view illustrating the oscillator coil and core of the embodiment shown in FIG. 2, and FIG. 4 is a perspective view of a second embodiment of the device of the invention.

Referring now to FIG. 1, a schematic drawing illustrating the basic operation of the device of the invention is shown. Magnetic core 11 has a coil 12 wound therearound, thereby forming an electromagnet. The electromagnet is energized by providing current from DC power source 13 thereto through variable resistor 15. The amount of current flowing through winding 12 is controlled by varying the resistance of variable resistor 15, thereby changing the magnitude of the magnetic flux in core 11. Placed on pole face 16 of core 11 is magnetic core 20, which has a substantially closed loop configuration with an air gap 67 formed thereon. A similar magnetic core 22 is placed on pole face 18. Placed on top of core members 20 and 22 is linear magnetic core 25. Core 25 extends well beyond the ends of cores 20 and 22. A series magnetic circuit is thus formed between core 11, core 20, core 25 and core 22 such that a change in the magnetic flux in core 11 effects a likewise flux change in cores 20, 25 and 22. Cores 20, 22 and 25 are fabricated of a magnetic material such as, for example, ferrite. Wound around core 20 is coil 30 which with capacitor 32 forms a tuning circuit for local oscillator 37. Coil 40, which is wound around bar 25, and series connected coil 42, which is wound around core 22, operating in conjunction with capacitor 43, provide the tuning circuit for mixer 47. Oscillator coil 30 is inductively coupled to mixer coil 40 by virtue of the mutual inductance therebetween, thus furnishing a local oscillator signal to the mixer circuit.

Mixer 47 may be of the conventional type utilized in superheterodyne receivers comprising a non linear device such as a vacuum tube of the pentode type. The tuning circuit comprising coil 40 and 42 and capacitor 43 is connected in the grid circuit of such tube, this tuning circuit being tuned to the desired reception frequency of the receiver. The oscillator signal which, as already noted, is also coupled to the mixer tuning circuit and fed therefrom to the grid of the mixer tube, has a frequency which differs from the reception frequency by the intermediate frequency. The plate circuit of the mixer tube is tuned to this intermediate frequency, signals being generated in the tube at such intermediate frequency by virtue of the heterodyning action between a signal at the reception frequency and the local oscillator signal.

The tuning of the local oscillator and mixer circuits is achieved by varying the resistance of resistor device 15, which may comprise a potentiometer or a Nichrome slider wire. This changes the magnetic flux in core 11 and thus the flux in the magnetic path between pole faces 16 and 18 which includes cores 20, 25 and 22. Such change of magnetic flux effectively varies the inductances of coils 30, 40 and 42, thereby effecting the simultaneous tuning of the local oscillator and mixer tuning circuits. It has been found that the utilization of an oscillator core 20 in the general configuration indicated, with a gap in a substantially closed loop core, enables extremely close tracking between the oscillator and mixer circuits. As is known, with a local oscillator operating at a frequency different from that of the mixer circuit, the difference frequency being the intermediate frequency, the local oscillator inductance must be made to change through a substantially different ratio than that of the mixer to achieve the proper tracking. With the core configuration of core 20, the desired ratio has been successfully achieved, this by virtue of the fact that a portion of the total flux flowing in the series path flows around the core loop.

Core member 22 and its associated winding 42, although not absolutely necessary for operation of the device of the invention, have been found to provide effective trimming of the mixer circuit to improve the tracking thereof still further.

If so desired, an R.F. input stage 49 can be coupled to core 25 through winding 50 which is wound on the core. This provides coupling of such a signal to the mixer coil 40.

Referring now to FIG. 2, a first embodiment of the device of the invention is shown. In this embodiment, components corresponding to those shown in FIG. 1 are identified by the same numerals. Control flux is provided by means of the electromagnet formed by magnetic core 11 having windings 12 wound theeron. Control current is fed to winding 12 through cable 65 from control unit 60, which can be located at a remote location. Power is fed to control unit 60 on power line 63 from a DC power source (not shown). The current flowing from the power source to coil 12 through cable 65 is controlled by means of control 15 which may comprise a potentiometer. An appropriate calibrated dial 70 may be used to indicate the tuning of the radio receiver. Mounted directly on pole face 16 and abutting thereagainst is core member 20 which has oscillator coil 30 wound thereon. Core member 20, which may be fabricated of ferrite, has a generally toroidal configuration with a gap 67 formed therein. The details of construction of the oscillator coil and its associated core can best be seen in FIG. 3. Resting on top of core 20 is flat bar 25, which forms a core for mixer coil 40. Bar 25 is also preferably fabricated of ferrite. Bar 25 rests directly on pole face 18 of core 11. The ends of bar 25 extend well beyond pole faces 16 and 18.

As already noted, tuning is effected by varying the resistance of control 15, thereby changing the current in coil 12 and magnetic flux in the various cores. This causes a change of inductance which effects the desired tuning, proper tracking being achieved by virtue of the combined configuration of the oscillator and mixer cores. The elongated ferrite bar 25 provides the additional function of a pick-up antenna. Thus with the ferrite bar serving as an antenna, signal energy is coupled directly through the core to mixer coil 40. This combines the function of antenna and mixer and oscillator tuning circuits in one unit, thereby lessening the number of components and making for more economical fabrication. This end result is achieved with an attendant increase in sensitivity and selectivity.

The precise shapes of cores 20, 22 and 25 are not critical, as long as cores 20 and 22 each form a substantially closed magnetic loop and all of these cores are included in a series magnetic circuit with core 11. The significance of this arrangement is that cores 20 and 22 form separate closed loop magnetic circuits which are in series with the larger circuit including core 11; such that the magnetic excitation of core 11 effects a likewise magnetic excitation of cores 20 and 22.

While the embodiment illustrated in FIG. 2 operates quite satisfactorily and has an advantage of economy, still further improved performance can be achieved with the embodiment illustrated in FIG. 4. With this embodiment, greater sensitivity and selectivity as well as improved tracking is achieved. The embodiment of FIG. 4 is a similar to that of FIG. 2, except for the following added components: Mixer coil 40 includes center winding 77 having windings 70, 71 and 72 attached to one end thereof, and winding 42 attached to the opposite end thereof. Winding 42 is wound around a substantially closed loop toroidal core similar in configuration to core 20 which is used for the oscillator. Core 22 is placed on the other pole face of core 11 in the same fashion as is core 20, with ferrite bar now resting on cores 20 and 22. An opening 75 is formed in bar 25, and through this opening and the end of the bar, winding 71 is wound so that its windings run at approximately right angles to those of winding 77 so as to minimize mutual coupling between the two windings. Windings 70 and 72 are used to conveniently effect the transition between the perpendicularly oriented windings and to provide more efficient coupling of oscillator coil 30 to the mixer. The use of winding 71 has been found to substantially increase the effective signal input to the mixer stage. Winding 50, which is wound through slot 70 formed in core 25, is utilized to effectively couple the input from an RF amplifier, antenna, or other such source. This provides inductive coupling from the external source such that there is no significant loading of the mixer or oscillator circuits.

In an operative model of the device of the invention, extraordinarily high overall sensitivity and selectivity was achieved without utilizing a radio frequency amplifier, and without resorting to any special circuitry in the receiver itself. This is attributed primarily to the excellent tracking and overall efficiency achieved by virtue of the tuning unit.

While the device of the invention has been described and illustrated in detail, it is to be clearly understood that this is intended by way of illustration and example only and is not to be taken by way of limitation, the spirit and scope of this invention being limited only by the terms of the following claims.

I claim:

1. A device for remotely tuning a plurality of radio frequency circuits comprising.

an electromagnet having a core and an excitation winding wound around said core, the ends of said core forming magnetic pole faces, a DC power source, means interposed between said power source and said winding for providing a controllable amount of current to said winding, a first inductor unit comprising a substantially closed loop magnetic core and a winding wound around said core, a portion of said core abutting against one of said pole faces, a second inductor comprising an elongated core and a coil wound on said core, said elongated core resting on top of said substantially closed loop core near one end thereof and on the other of the pole faces of said electromagnet near the other end thereof, the ends of said elongated core extending substantially beyond said pole faces, whereby the cores of said electromagnet and said inductors form a series magnetic circuit so that the inductances thereof are varied simultaneously in accordance with the current in said electromagnet winding.

2. The device as recited in claim 1 wherein said means for providing a controllable amount of current to said winding comprises a potentiometer.

3. The device as recited in claim 1 wherein said substantially closed loop core is toroidal.

4. The device as recited in claim 1 wherein the core of said second inductor is in the form of a linear bar.

5. A device for remotely tuning the mixer and oscillator circuits of a radio receiver comprising, an electromagnet having a substantially U-shaped core, the ends of said core forming pole faces and an excitation winding wound around said core, a DC power source, means interposed between said power source and said winding for providing a controllable amount of current to said winding, an oscillator inductor unit comprising a substantially toroidal shaped magnetic core and a winding wound around said core, a portion of said toroidal core abutting against one of said pole faces, a mixer inductor comprising an elongated core and a coil wound on said core, said elongated core resting on top of said toroidal core near one end thereof and on the other of the pole faces of said electromagnet near the other end thereof, the ends of said elongated core extending substantially beyond said pole faces, whereby the cores of said electromagnet and said inductors form a series magnetic circuit so that the inductances thereof are varied simultaneously in accordance with the current in said electromagnet winding.

6. The device as recited in claim 5 wherein said elongated core is in the form of a linear bar.

7. The device as rectified in claim 5 wherein said magnetic cores are fabricated of ferrite.

8. The device as recited in claim 5 wherein said mixer inductor coil includes a first winding wound substantially normal to the longitudinal axis of said elongated core and a second winding wound substantially normal to said first winding.

9. The device as recited in claim 8 and further including a second toroidal core, said mixer inductor coil including a third winding wound around said second toroidal core, said second toroidal core being interposed between said elongated core and the other of the pole faces of said electromagnet.

10. The device as recited in claim 9 and further including a radio frequency input winding, an opening being formed in said elongated core, said radio frequency input winding being wound on said elongated core through said opening.

11. A device for simultaneously tuning a plurality of radio frequency circuits comprising an electromagnet including a magnetic core having a pair of oppositely positioned pole faces and an excitation winding wound thereon, an air gap being formed between said pole faces, a first tuning inductor comprising a substantially closed loop magnetic core and a winding wound around said core, said winding being connected in circuit with one of the circuits to be tuned, a second tuning inductor comprising an elongated linear magnetic core and a winding wound around said core, the winding of said second inductor member being connected to another of the circuits to be tuned, a portion of one of the surfaces of said first inductor being positioned in abutment against one of the pole faces of said electromagnet, a portion of said second inductor proximate to one end thereof being positioned in abutment with the surface of said first inductor opposite said one surface thereof, a portion of said second inductor proximate to the other end thereof being positioned in abutment against the other of the pole faces of said electromagnet, the end portions of said linear inductor extending substantially beyond said pole faces, the cores of said electromagnet and said first and second inductors forming a series magnetic circuit, means for providing a DC current to said electromagnet, and means for controlling the current to said electromagnet to tune said radio frequency circuits.

12. The device as recited in claim 11 wherein said linear magnetic core comprises a ferrite bar.

13. The device as recited in claim 12 wherein said first inductor comprises a toroid.

14. A device for simultaneously tuning a plurality of radio frequency circuits comprising an electromagnet comprising a magnetic core having a pair of oppositely positioned pole faces and an excitation winding wound therearound, an air gap being formed between said pole faces, a first tuning inductor comprising a substantially toroidal magnetic core and a winding wound on said core, said winding being connected in circuit with one of the circuits to be tuned, a second tuning inductor comprising an elongated bar shaped magnetic core, a first winding wound around said bar shaped core, a substantially toroidal magnetic core and a second winding wound around said toroidal core, said first and second windings being connected in series with each other and to another of the circuits to be tuned, a portion of one of the surfaces of said first inductor being positioned in abutment against one of the pole faces of said electromagnet, a portion of said bar shaped core proximate to one end thereof being positioned in abutment with the surface of said first inductor member opposite said one surface thereof, the torodial core of said second inductor being positioned between the other of the pole faces of said electromagnet and a portion of the other end of said bar shaped core, the end portions of said bar shaped core extending substantially beyond said pole faces, the cores of said electromagnet and said first and second inductors forming a series magnetic circuit, means for providing a DC current to said electromagnet, and means for controlling the current to said electromagnet to tune said radio frequency circuits.

References Cited

UNITED STATES PATENTS

| | | | |
|---|---|---|---|
| 2,786,940 | 3/1957 | Crofts | 334—12 X |
| 2,837,648 | 6/1958 | Gabor | 334—12 X |
| 2,849,604 | 8/1958 | Przedpelski | 334—12 X |
| 2,897,352 | 7/1959 | Smith-Vaniz | 334—12 X |

HERMAN KARL SAALBACH, *Primary Examiner.*

R. F. HUNT, E. LIEBERMAN, *Assistant Examiners.*